(12) United States Patent
Tao

(10) Patent No.: US 6,559,483 B2
(45) Date of Patent: May 6, 2003

(54) SEMICONDUCTOR DEVICE COMPRISING AN ARRANGEMENT OF AN ELECTRICALLY PROGRAMMABLE NON-VOLATILE MEMORY ELEMENT

(75) Inventor: Guoqiao Tao, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/024,760

(22) Filed: Dec. 20, 2001

(65) Prior Publication Data

US 2002/0079513 A1 Jun. 27, 2002

(30) Foreign Application Priority Data

Dec. 22, 2000 (EP) ............................................ 00204786

(51) Int. Cl.7 .......................................... H01L 31/0328
(52) U.S. Cl. ........................ 257/200; 257/200; 257/209; 438/128
(58) Field of Search .................................. 257/200, 529, 257/209, 706; 357/235, 51; 365/104, 185.18; 638/601

(56) References Cited

U.S. PATENT DOCUMENTS

| 4,507,756 A | * | 3/1985 | McElroy ...................... 365/104 |
| 4,814,853 A | * | 3/1989 | Uchida ......................... 357/51 |
| 6,259,146 B1 | * | 7/2001 | Giust et al. .................. 257/529 |
| 6,496,416 B1 | * | 12/2002 | Look ...................... 365/185.18 |

* cited by examiner

Primary Examiner—David Nelms
Assistant Examiner—Thinh Nguyen
(74) Attorney, Agent, or Firm—Aaron Waxler

(57) ABSTRACT

The invention relates to a semiconductor device comprising an arrangement of an electrically programmable non-volatile memory element (1), formed on a semiconductor surface (2), for storing a data bit; the non-volatile memory element (1) including a fuse wire (3) and a heating wire (4); the fuse wire (3) being arranged as a planar line, and further being arranged as a memory element to be programmable by blowing the fuse wire (3) through joule heating induced by a current flow; the heating wire (4) being arranged as a heater spatially surrounding the fuse wire (3), and the heating wire (4) being arranged to generate additional heat by current flow induced joule heating and to provide said additional heat to the fuse wire (3) during programming of the fuse wire (3).

8 Claims, 2 Drawing Sheets

SEMICONDUCTOR DEVICE COMPRISING AN ARRANGEMENT OF AN ELECTRICALLY PROGRAMMABLE NON-VOLATILE MEMORY ELEMENT

The present invention relates to a semiconductor device comprising an arrangement of a non-volatile memory element.

Small-size programmable non-volatile memories are used in a plurality of microelectronic products, such as logic and analogue devices, for example to identify a die or a product. Other applications involve storage for e.g. security bits, electronic keys, network address bits, and low-density operating system codes.

Several methods of incorporating small-size programmable non-volatile memories in a semiconductor device are known: e.g. laser cutting of dedicated wiring patterns, application of single-poly (E)EPROMS, application of dedicated non-volatile devices like EPROM, EEPROM, or Flash-memory, and the application of fuse wires.

In general, these methods from the prior art are lacking in cost-effectiveness, reliability and scalability. For example, laser cutting may damage passivation layers in the semiconductor device. Moreover, laser cutting is a relatively slow process, which disadvantageously reduces the overall process throughput.

Application of dedicated non-volatile devices like EPROM, EEPROM, or Flash-memory requires many additional processing steps, which add to the cost of the product.

Single-poly (E)EPROMS require a lower tunnel oxide limit of approximately 7 nm, for proper data retention and low leakage currents. In deep sub-micron processes, for example 0.25 $\mu$m and below, the gate oxide is typically less than 7 nm. Thus, for (E)EPROMS additional processing steps are required which add to the manufacturing costs.

Finally, a fuse wire provides a relatively simple memory element which, during a programming step, can be written by joule heating induced by a current flow in the fuse wire. The fuse wire melts and disconnects during such a programming step.

However, the energy dissipation necessary to fuse a fuse wire may require a current flow that is too high to be provided through the fuse wire itself. From the prior art, it is known that programming of a fuse wire memory element can be improved by providing an additional heating wire, which is positioned close to the fuse wire, and which locally supplies additional heat to the fuse wire programmed by joule heating of such an additional heating wire.

U.S. Pat. No. 3,699,403 describes such heating wire elements in a matrix of diodes on a semiconductor surface. The heating wire elements are arranged as planar wires that provide additional heat to the diodes in the matrix. A diode is programmed by a current flow, whose energy dissipation in combination with the heat from the heating wire is sufficient to fuse the diode.

U.S. Pat. No. 4,814,853 discloses a semiconductor device with a programmable fuse, in which a planar heating wire is formed on a substrate. Separated by an insulation layer, a planar fuse wire is formed on top of the heating wire. The fuse wire extends in a direction perpendicular to the direction of the heating wire. Due to the crossing of the fuse wire and the heating wire, the additional heat generated by the heating wire affects the fuse wire only at the crossing, which results in a more reliable and better localized fusing process.

U.S. Pat. No. 5,444,287 describes a thermally activated noise immune fuse in a semiconductor device. This fuse comprises a fuse wire and a heating wire which are thermally coupled by a coupling layer. The coupling layer transfers the heat from the heating wire to the fuse wire during programming. The heating wire may run parallel to the fuse wire in the same plane. Also, the heating wire may cross the fuse wire in a plane below, or above the plane comprising the fuse wire. The arrangement of the fuse disclosed in U.S. Pat. No. 5,444,287 is less susceptible to inadvertent programming due to voltage spikes (noise) on one of the wires.

Difficulties regarding for reliable programming of fuse wires from the prior art arise when feature sizes are reduced to the (deep) sub-micron level. Since the supply voltage ($V_{cc}$) in microelectronic devices scales down with the reduction in feature size, in the process generation of 0.25 $\mu$m the energy dissipation already becomes critical (with $V_{cc}$=2.5 V). In future process generations below 0.25 $\mu$m, when the supply voltage is expected to reduce further, programming of fuse wire memory elements will become even more difficult. Moreover, since the overlapping area between the fuse wire and the heating wire becomes smaller due to the reduction of the line widths, the heat exchange area also becomes smaller, leading to relatively larger thermal losses and a lower efficiency.

It is an object of the present invention to provide a semiconductor device comprising an arrangement of an electrically programmable non-volatile memory element which may be operated at a low voltage.

The present invention relates to a semiconductor device comprising an arrangement of an electrically programmable non-volatile memory element, formed on a semiconductor surface, for storing a data bit; the non-volatile memory element comprising a fuse wire and a heating wire; the fuse wire being arranged as a planar line, and further being arranged as a memory element to be programmable by blowing the fuse wire through joule heating induced by a current flow; the heating wire being arranged to generate additional heat by current flow-induced joule heating and to provide said additional heat to the fuse wire during programming of the fuse wire;
characterized in that the heating wire is arranged as a heater spatially surrounding the fuse wire.

Also, the present invention relates to a semiconductor device comprising an arrangement of an electrically programmable non-volatile memory element, as described above, characterized in that the heating wire comprises horizontal wire parts and vertical wire parts; the horizontal wire parts and the vertical wire parts being arranged in a series connection to form the heating wire.

Moreover, the present invention relates to a semiconductor device comprising an arrangement of an electrically programmable non-volatile memory element as described above, characterized in that the horizontal wire parts are formed as horizontal lines in local interconnect and metallization layers of the semiconductor device, and
the vertical wire parts are being formed as vertical contacts and vias in the semiconductor device.

Furthermore, the present invention relates to a semiconductor device comprising an arrangement of an electrically programmable non-volatile memory element as described above, characterized in that the horizontal lines in local interconnect and metallization layers of the semiconductor device, and the vertical contacts and vias in the semiconductor device, are formed as sub-micron level parts of the semiconductor device.

If the non-volatile memory element comprises a metallization layer of the semiconductor device such as the first metallization layer known in the art as "Metal One", the present invention also relates to a semiconductor device comprising an arrangement of an electrically programmable non-volatile memory element, characterized in that the fuse wire is formed in a metallization level layer of the semiconductor device.

And in that case, the present invention relates to a semiconductor device comprising an arrangement of an electrically programmable non-volatile memory element, characterized in that the heater spatially surrounding the fuse wire is arranged as a series of open loops around the fuse wire; the open loops twisting in a direction parallel to the fuse wire.

Alternatively, the fuse wire may be formed in the local interconnect layer of the semiconductor device. Then, the present invention also relates to a semiconductor device comprising an arrangement of an electrically programmable non-volatile memory element, characterized in that the fuse wire is formed in a local interconnect layer of the semiconductor device.

Furthermore, the present invention relates to a semiconductor device comprising an arrangement of an electrically programmable non-volatile memory element, characterized in that the heater spatially surrounding the fuse wire is arranged as a series of half-loops around the fuse wire; the half-loops twisting in a direction parallel to the fuse wire.

Advantageously, the present invention provides a semiconductor device in which programming of a non-volatile memory element can be done with high reliability.

Below, the invention will be explained with reference to some drawings, which are intended for illustration purposes only and not to limit the scope of protection as defined in the accompanying claims.

Figure 1:
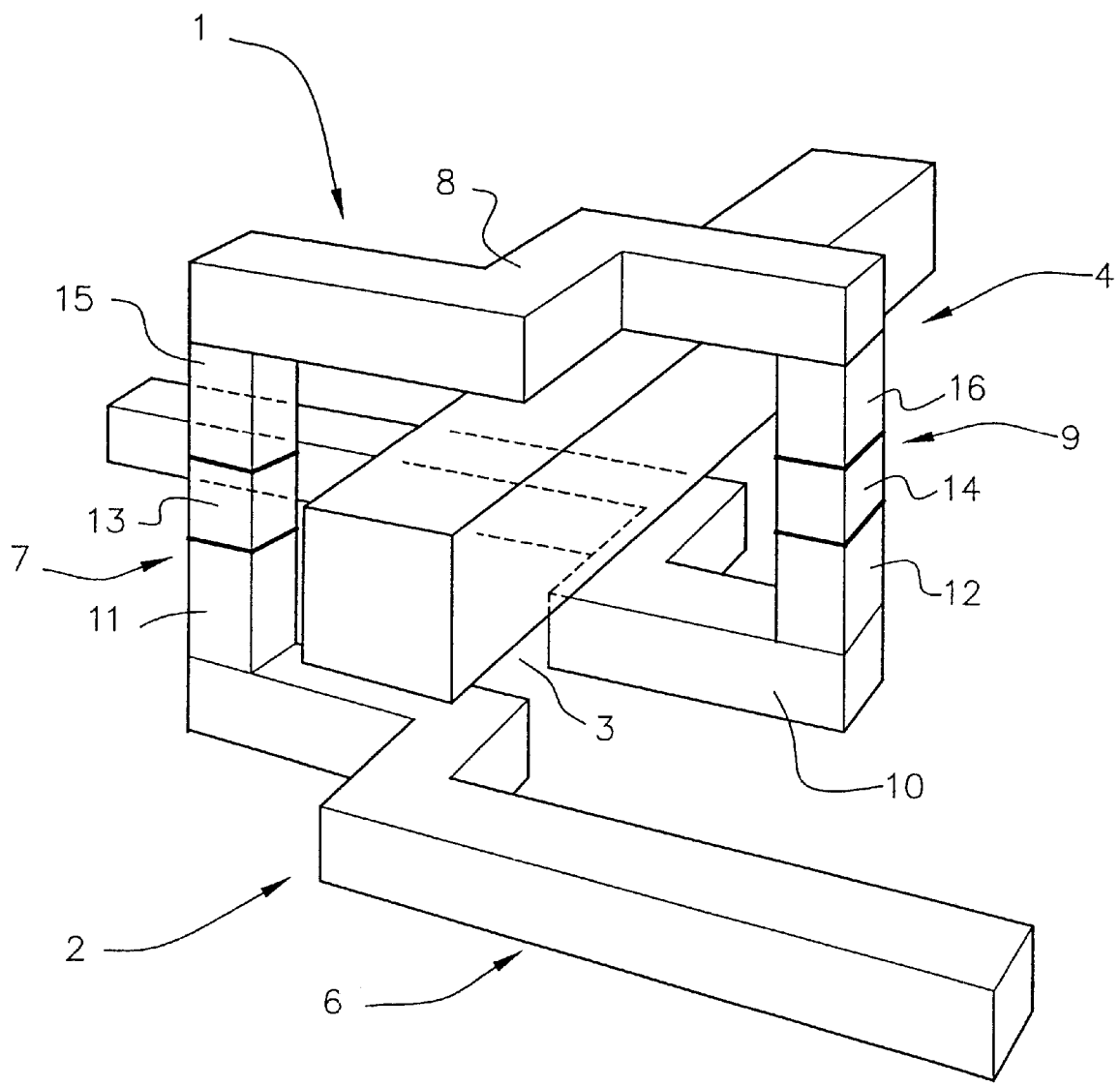
FIG. 1 shows diagrammatically a perspective drawing of a first embodiment of a semiconductor device comprising an electrically programmable non-volatile memory element in accordance with the invention.

The present invention provides a semiconductor device comprising an arrangement of an electrically programmable non-volatile memory element comprising a fuse wire and a heating wire. In the arrangement the energy dissipation in the fuse wire is locally enlarged. The heating wire wraps around or meanders along the fuse wire to create a spatial area in which, during programming, the heat generation is sufficiently enhanced to blow the fuse wire. FIG. 1 shows diagrammatically a perspective drawing of a first embodiment of a semiconductor device comprising an electrically programmable non-volatile memory element in accordance with the invention.

A non-volatile memory element 1 is formed on a semiconductor surface 2. A fuse wire 3 is surrounded by a looping heating wire 4. Both the fuse wire 3 and the heating wire 4 are, preferably, embedded in insulating material, which, for reasons of clarity, is not shown here. The heating wire 4 comprises a first lower horizontal wire 6, a first vertical wire 7, a first upper horizontal wire 8, a second vertical wire 9, and a second lower horizontal wire 10.

It is observed that "horizontal" and "vertical" are, here, defined in relation to the surface 2 and not in relation to the earth's surface. Moreover, it may be conceivable that (some) wire parts are slanted relative to the surface 2.

The heating wire 4 is formed by connecting in a series connection the first lower horizontal wire 6, the first vertical wire 7, the first upper horizontal wire 8, the second vertical wire 9, and the second lower horizontal wire 10. The horizontal wires are substantially straight lines, with small steps in a direction parallel to the fuse wire 3, in order to create a heating wire 4 as an open loop. Similarly, the vertical wires which are depicted as straight lines, may contain small steps in a direction parallel to the fuse wire 3.

Both fuse wire 3 and heating wire 4 comprise connecting pads (not shown) for electrical connections. As known to persons skilled in the art, fuse wire 3 and heating wire 4 are typically connected to a selection circuitry (not shown) that can select a particular fuse wire for programming and/or reading.

The non-volatile memory element 1 can be manufactured during the standard processing steps for fabricating semiconductor devices (integrated circuits) as known in the art. No additional processing steps are needed. In the following, an example of the fabrication of the non-volatile memory element 1 is briefly explained.

The first lower horizontal wire 6 and the second lower horizontal wire 10 are formed during the formation of the local interconnect lines of the semiconductor device in which the non-volatile memory element 1 is integrated, by using the same processing steps.

The first vertical wire 7 and the second vertical wire 9, respectively, each comprise a plurality of parts: a contact part 11 and 12 respectively, a metal part 13 and 14, respectively, and a via part 15 and 16, respectively. The metal parts 13, 14 interconnect the contact parts 11, 12 and via parts 15, 16, as shown. The contact parts 11, 12, the metal parts 13, 14 and the via parts 15, 16 are manufactured in a sequence of processing steps. In a first step, the level containing the first lower horizontal wire 6 and the second lower horizontal wire 10, is covered by an insulating layer, preferably $SiO_2$.

By a patterning process comprising lithography and etching, a contact opening is created. The contact opening is then filled by metal, using further processing steps as known in the art.

In a subsequent processing sequence comprising deposition of a metal layer, lithography, etching, and deposition of a dielectric layer, the metal parts 13 and 14 are defined. In this sequence also the fuse wire 3 is patterned in the dielectric layer.

Alternatively, in this process step, the openings intended to contain the metal parts 13 and 14 are defined by a processing sequence comprising deposition of an insulating layer, lithography, and etching. In this sequence, the trench defining the fuse wire 3 is patterned in the insulating layer. Subsequently, the openings and the trench are filled with metal to form the metal parts 13, 14 and the fuse wire 3, respectively. For said filling process use is made of regular processing steps as known to persons skilled in the art.

The first vertical wire 7 and the second vertical wire 9 are completed in a further processing sequence comprising deposition of an insulating layer, lithography and patterning, to define openings so as to form the via parts 15 and 16, respectively. The via parts 15, 16 are formed by metal-filling the latter openings by processing as known in the art.

In a last processing sequence, the first upper horizontal wire 8 is created by a metallization and patterning process as known in the art. For example, a metal layer is deposited in which the first upper horizontal wire 8 is defined by lithography and etching. Subsequently, a dielectric layer is deposited.

In an alternative processing sequence, an insulating layer is deposited in which a trench, defining the first upper horizontal wire 8, is formed by a patterning process as known in the art. By a subsequent metal-filling operation the first upper horizontal wire 8 is formed.

In this first preferred embodiment, the heating wire comprises a single loop for generating a local hot spot in the fuse wire. It is noted that depending on the actual energy dissipation the heating wire may comprise more than a single loop. In that case, additional lower horizontal, upper horizontal and vertical wires need to be manufactured during the processing sequence.

It is noted here, that the processing steps described above only disclose the basic steps for defining the non-volatile memory element 1 as shown in FIG. 1. The processing sequence may comprise additional processing steps as known to persons skilled in the art, for example a planarisation step may be applied as well.

In the first preferred embodiment, the fuse wire 3 is formed as a metal line in the first metallization level, known as "metal one". However, the fuse wire 3 may also be formed as a metal line in a higher metallization level. In that case, the heating wire 4 can surround the fuse wire 3 by looping from a lower metallization level, below the level of the fuse wire 3, to a higher metallization level above the fuse wire 3.

Figure 2:
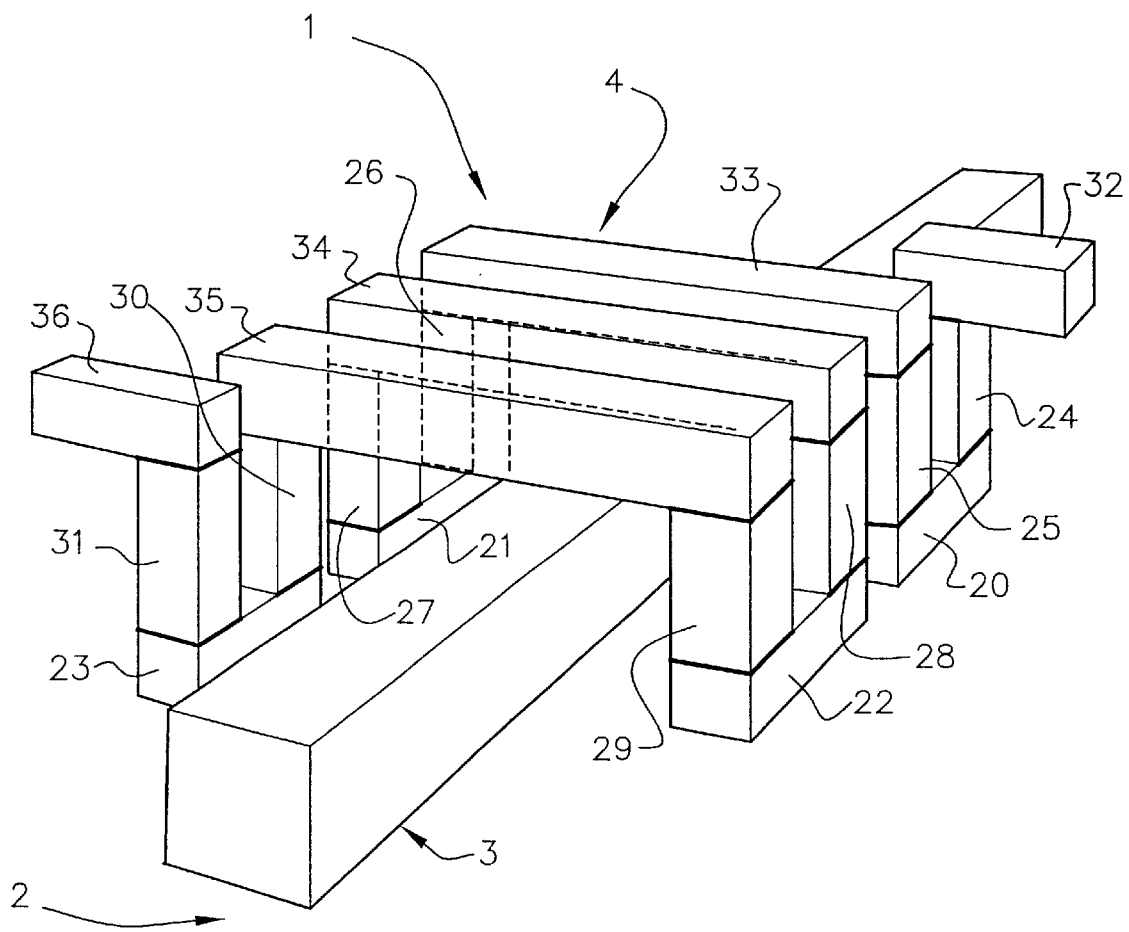
FIG. 2 shows diagrammatically a perspective drawing of a second embodiment of a semiconductor device comprising an electrically programmable non-volatile memory element in accordance with the invention.

Alternatively, in a second preferred embodiment, the fuse wire 3 may be formed in the local interconnect level as a (doped) poly-silicon or silicide (e.g. titanium disilicide) line. FIG. 2 shows diagrammatically a perspective drawing of a second embodiment of a semiconductor device comprising an electrically programmable non-volatile memory element in accordance with the invention.

The non-volatile memory element 1 is formed on the semiconductor surface 2. The fuse wire 3 is surrounded sideways and along the top by half loops of the meandering heating wire 4. Both the fuse wire 3 and the heating wire 4 are, preferably, embedded in insulating material, which, for reasons of clarity, is not shown here. The heating wire comprises a first lower horizontal wire 20, a second lower horizontal wire 21, a third lower horizontal wire 22, and a fourth lower horizontal wire 23, each located at the local interconnect level. Further, the heating wire 4 comprises vertical parts, viz. a first vertical wire 24, a second vertical wire 25, a third vertical wire 26, a fourth vertical wire 27, a fifth vertical wire 28, a sixth vertical wire 29, a seventh vertical wire 30, and an eighth vertical wire 31. Above the fuse wire 3, the heating wire 4 comprises horizontal parts, viz. a first upper horizontal wire 32, a second upper horizontal wire 33, a third upper horizontal wire 34, a fourth upper horizontal wire 35, and a fifth upper horizontal wire 36. In FIG. 2, the second lower horizontal wire 21 and the fourth vertical wire 27 are only partially visible. The third vertical wire 26 which is hidden in the viewpoint of FIG. 2, is shown by dashed contour lines.

Again, it is noted that "horizontal" and "vertical" are, here, defined in relation to the surface 2 and not in relation to the earth's surface.

The heating wire is formed by connecting in a series connection the first upper horizontal wire 32, the first vertical wire 24, the first lower horizontal wire 20, the second vertical wire 25, the second upper horizontal wire 33, the third vertical wire 26, the second lower horizontal wire 21, the fourth vertical wire 27, the third upper horizontal wire 34, the fifth vertical wire 28, the third lower horizontal wire 22, the sixth vertical wire 29, the fourth upper horizontal wire 35, the seventh vertical wire 30, the fourth lower horizontal wire 23, the eighth vertical wire 31 and the fifth upper horizontal wire 36.

Both fuse wire 3 and heating wire 4 comprise a connection (not shown) for electrical connections to a selection circuitry as described earlier.

In this second preferred embodiment, the fuse wire 3, the first lower horizontal wire 20, the second lower horizontal wire 21, the third lower horizontal wire 22, and the fourth lower horizontal wire 23, each located at the local interconnect level, are formed during the formation of the local interconnect lines of the semiconductor device in which the non-volatile memory element 1 is integrated, by using the same processing steps.

The fuse wire 3, the first lower horizontal wire 20, the second lower horizontal wire 21, the third lower horizontal wire 22, and the fourth lower horizontal wire 23, may all consist of poly-silicon or silicide. The material for each component may also be chosen separately, depending on the actual processing sequence.

The first vertical wire 24 and the second vertical wire 25 each comprise a contact part which connects to the first lower horizontal wire 20. The third vertical wire 26 and the fourth vertical wire 27, each comprise a contact part which connects to the second lower horizontal wire 21. The fifth vertical wire 28 and the sixth vertical wire 29, each comprise a contact part which connects to the third lower horizontal wire 22. The seventh vertical wire 30 and the eighth vertical wire 31 each comprise a contact part which connects to the fourth lower horizontal wire 23. For example, the contact parts may all consist of a metal (e.g., Al, W), which is used for a contact-filling process as known to persons skilled in the art. Other materials may also be used, depending on the actual formation process of the contact parts.

In a first step, the level containing the fuse wire 3, the first lower horizontal wire 20, the second lower horizontal wire 21, the third lower horizontal wire 22, and the fourth lower horizontal wire 23, is covered by an insulating layer, preferably $SiO_2$.

In a second step, by a patterning process comprising lithography and etching, contact openings are created for the formation of the first and second vertical wire 24 and 25 connected to the first lower horizontal wire 20, the third and fourth vertical wire 26 and 27 connected to the second lower horizontal wire 21, the fifth and sixth vertical wire 28 and 29 connected to the third lower horizontal wire 22, and the seventh and eighth vertical wire 30 and 31 connected to the fourth lower horizontal wire 23, respectively. The contact openings are then filled with metal, using further processing steps as known in the art.

In a subsequent processing sequence comprising deposition of an insulating layer, lithography and etching, the openings to connect each of the upper horizontal wires to the respective vertical wires, are defined. In this sequence also the trenches defining the upper horizontal wires 32, 33, 34, 35, 36 are patterned in the insulating layer.

Subsequently, the openings and the trenches are filled with metal to form the upper horizontal wires and their connections to the vertical wires. Metal filling is carried out in regular processing steps as known to persons skilled in the art.

Alternatively, the upper horizontal wires 32, 33, 34, 35, 36 may be formed by a process sequence of metal deposition, lithography, etching, and deposition of a dielectric layer, as known to persons versed in the art.

In this second preferred embodiment, the heating wire 4 comprises three half loops for generating a local hot spot in the fuse wire. It is noted that depending on the actual energy dissipation, the heating wire may comprise any other number of half loops. In that case, the number of lower horizontal, upper horizontal, and vertical wires to be manufactured has to be changed accordingly.

In this second preferred embodiment, the vertical and horizontal parts of the heating wire 4 are straight lines. However, both the vertical and horizontal parts of the heating wire 4 may comprise small steps parallel to the direction of the fuse wire 3, if required. As known to persons skilled in the art, the processing sequence is not affected in that case.

It will now be appreciated that all processing sequences mentioned in the formation of the non-volatile memory element 1 correspond to the known regular processing steps which are used at the particular stages of fabrication of a specific semiconductor device in which the non-volatile memory element 1 is integrated. No further processing steps are required.

Also, it will be appreciated that the shape of the non-volatile memory element 1 is not limited to a full loop or a number of half loops comprising upper horizontal wires 32, 33, 34, 35 above the fuse wire 3. It may be conceivable that the horizontal wires of the half loops are only present below the fuse wire 3 in a "u" shape, or even, that a single half loop comprises only a vertical wire at one side of the fuse wire 3 in a "u" shape, rotated through 90 degrees.

The non-volatile memory element 1 can be programmed electrically, for example, on the product tester, or after packaging. During programming, the heating wire 4 is heated by a current flow, providing additional heat in a spatial area of the heating wire loop (or half loop). As a result, the energy dissipation required in the fuse wire 3 to program successfully will be much smaller and therefore more scalable to lower voltage operations. During reading of the non-volatile memory element 1, the electrical conduction of the fuse wire is probed. At this stage, the heater wire is not heated, which, if the fuse wire is still intact, limits the power dissipation around the fuse wire 3, and thus self-heating of the fuse wire 3 (and blowing the fuse wire 3, inadvertently). As a result, a better reliability of the read operations is provided.

Furthermore, it is noted that since the fuses are principally passive elements, no direct link exists to the active elements such as diodes and transistors. Therefore, the concept of the present invention is generally applicable to semiconductor devices comprising a non-volatile memory element 1.

A further optimization in the present concept is possible, with respect to the joule-heat dissipation or the thermal gradient, needed for the programming conditions.

What is claimed is:

1. A semiconductor device comprising an arrangement of an electrically programmable non-volatile memory element (1), formed on a semiconductor surface (2), for storing a data bit; the non-volatile memory element (1) comprising a fuse wire (3) and a heating wire (4); the fuse wire (3) being arranged as a planar line, and further being arranged as a memory element to be programmable by blowing the fuse wire (3) through joule heating induced by a current flow; the heating wire (4) being arranged to generate additional heat by current flow-induced joule heating and to provide said additional heat to the fuse wire (3) during programming of the fuse wire (3), characterized in that the heating wire (4) is arranged as a heater spatially surrounding the fuse wire (3).

2. A semiconductor device comprising an arrangement of an electrically programmable non-volatile memory element (1) according to claim 1, characterized in that the heating wire (4) comprises horizontal wire parts and vertical wire parts;

the horizontal wire parts and the vertical wire parts being arranged in a series connection to form the heating wire (4).

3. A semiconductor device comprising an arrangement of an electrically programmable non-volatile memory element (1) according to claim 2, characterized in that the horizontal wire parts are formed as horizontal lines in local interconnect and metallization layers of the semiconductor device, and the vertical wire parts are formed as vertical contacts and vias in the semiconductor device.

4. A semiconductor device comprising an arrangement of an electrically programmable non-volatile memory element (1) according to claim 3, characterized in that the horizontal lines in local interconnect and metallization layers of the semiconductor device and the vertical contacts and vias in the semiconductor device are being formed as sub-micron level parts of the semiconductor device.

5. A semiconductor device comprising an arrangement of an electrically programmable non-volatile memory element (1) according to claim 1, characterized in that the fuse wire (3) is formed in a metallization level layer of the semiconductor device.

6. A semiconductor device comprising an arrangement of an electrically programmable non-volatile memory element (1) according to claim 5, characterized in that the heater spatially surrounding the fuse wire (3) is arranged as a series of open loops around the fuse wire (3); the open loops twisting in a direction parallel to the fuse wire (3).

7. A semiconductor device comprising an arrangement of an electrically programmable non-volatile memory element (1) according to claim 1, characterized in that the fuse wire (3) is formed in a local interconnect layer of the semiconductor device.

8. A semiconductor device comprising an arrangement of an electrically programmable non-volatile memory element (1) according to claim 5, characterized in that the heater spatially surrounding the fuse wire (3) is arranged as a series of half loops around the fuse wire (3); the half loops twisting in a direction parallel to the fuse wire (3).

* * * * *